United States Patent
Kirby et al.

(10) Patent No.: US 10,685,878 B2
(45) Date of Patent: Jun. 16, 2020

(54) MICROELECTRONIC DEVICES WITH THROUGH-SUBSTRATE INTERCONNECTS AND ASSOCIATED METHODS OF MANUFACTURING

(71) Applicant: Micron Technology, Inc., Boise, ID (US)

(72) Inventors: Kyle K. Kirby, Eagle, ID (US); Kunal R. Parekh, Boise, ID (US); Sarah A. Niroumand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/563,953

(22) Filed: Dec. 8, 2014

(65) Prior Publication Data

US 2015/0093892 A1 Apr. 2, 2015

Related U.S. Application Data

(62) Division of application No. 12/701,800, filed on Feb. 8, 2010, now Pat. No. 8,907,457.

(51) Int. Cl.
*H01L 21/768* (2006.01)
*H01L 23/48* (2006.01)
(Continued)

(52) U.S. Cl.
CPC .. *H01L 21/76877* (2013.01); *H01L 21/30604* (2013.01); *H01L 21/31111* (2013.01);
(Continued)

(58) Field of Classification Search
CPC ............. H01L 21/76898; H01L 23/49827
See application file for complete search history.

(56) References Cited

U.S. PATENT DOCUMENTS

| | | |
|---|---|---|
| 5,173,442 A | 12/1992 | Carey |
| 6,107,186 A | 8/2000 | Erb |

(Continued)

FOREIGN PATENT DOCUMENTS

| | | |
|---|---|---|
| EP | 1686623 A1 | 8/2006 |
| KR | 20050073372 A | 7/2005 |

(Continued)

OTHER PUBLICATIONS

Office Action dated May 18, 2015 in China App. No. 201180014446.4, 22 pages.

(Continued)

*Primary Examiner* — Jae Lee
(74) *Attorney, Agent, or Firm* — Perkins Coie LLP

(57) ABSTRACT

Microelectronic devices with through-substrate interconnects and associated methods of manufacturing are disclosed herein. In one embodiment, a semiconductor device includes a semiconductor substrate carrying first and second metallization layers. The second metallization layer is spaced apart from the semiconductor substrate with the first metallization layer therebetween. The semiconductor device also includes a conductive interconnect extending at least partially through the semiconductor substrate. The first metallization layer is in electrical contact with the conductive interconnect via the second metallization layer.

17 Claims, 14 Drawing Sheets

(51) Int. Cl.
  *H01L 23/00* (2006.01)
  *H01L 25/065* (2006.01)
  *H01L 25/00* (2006.01)
  *H01L 21/306* (2006.01)
  *H01L 21/311* (2006.01)

(52) U.S. Cl.
  CPC .. *H01L 21/76805* (2013.01); *H01L 21/76883* (2013.01); *H01L 21/76898* (2013.01); *H01L 23/481* (2013.01); *H01L 24/06* (2013.01); *H01L 25/0657* (2013.01); *H01L 25/50* (2013.01); *H01L 24/13* (2013.01); *H01L 2224/0401* (2013.01); *H01L 2224/05009* (2013.01); *H01L 2224/0557* (2013.01); *H01L 2224/05647* (2013.01); *H01L 2224/06181* (2013.01); *H01L 2224/13025* (2013.01); *H01L 2224/16146* (2013.01); *H01L 2225/06513* (2013.01); *H01L 2225/06544* (2013.01); *H01L 2225/06548* (2013.01); *H01L 2924/0002* (2013.01); *H01L 2924/00014* (2013.01); *H01L 2924/014* (2013.01); *H01L 2924/0105* (2013.01); *H01L 2924/01006* (2013.01); *H01L 2924/01013* (2013.01); *H01L 2924/01029* (2013.01); *H01L 2924/01033* (2013.01); *H01L 2924/01073* (2013.01); *H01L 2924/01074* (2013.01); *H01L 2924/01079* (2013.01); *H01L 2924/01082* (2013.01); *H01L 2924/04941* (2013.01); *H01L 2924/12042* (2013.01); *H01L 2924/1306* (2013.01); *H01L 2924/13091* (2013.01); *H01L 2924/14* (2013.01)

(56) References Cited

U.S. PATENT DOCUMENTS

| | | |
|---|---|---|
| 6,221,769 B1 | 4/2001 | Dhong et al. |
| 6,455,425 B1 | 9/2002 | Besser et al. |
| 6,582,992 B2 | 6/2003 | Poo et al. |
| 6,903,443 B2 | 6/2005 | Farnworth et al. |
| 6,962,867 B2 | 11/2005 | Jackson et al. |
| 7,091,124 B2 | 8/2006 | Rigg et al. |
| 7,111,149 B2 | 9/2006 | Eilert |
| 7,317,256 B2 | 1/2008 | Williams et al. |
| 7,449,098 B1 | 11/2008 | Mayer et al. |
| 7,745,931 B2 | 6/2010 | Takao |
| 8,039,962 B2 * | 10/2011 | Lee ............. H01L 21/76898 257/750 |
| 8,278,152 B2 * | 10/2012 | Liu ............. H01L 21/76898 257/621 |
| 2002/0064729 A1 | 5/2002 | Ching et al. |
| 2003/0113967 A1 | 6/2003 | Allman et al. |
| 2003/0234416 A1 | 12/2003 | Thomas et al. |
| 2004/0048459 A1 | 3/2004 | Patti |
| 2004/0121521 A1 | 6/2004 | Jackson et al. |
| 2005/0001326 A1 | 1/2005 | Masuda |
| 2005/0009333 A1 | 1/2005 | Lee et al. |
| 2005/0029630 A1 | 2/2005 | Matsuo |
| 2005/0224921 A1 * | 10/2005 | Gupta ............. H01L 21/76898 257/621 |
| 2006/0046461 A1 | 3/2006 | Benson et al. |
| 2006/0246699 A1 | 11/2006 | Weidman et al. |
| 2006/0258111 A1 | 11/2006 | Jagueneau et al. |
| 2006/0270196 A1 | 11/2006 | Kirby |
| 2007/0048896 A1 | 3/2007 | Andry et al. |
| 2007/0063240 A1 | 3/2007 | Torres et al. |
| 2007/0178694 A1 | 8/2007 | Hiatt |
| 2008/0164573 A1 | 7/2008 | Basker et al. |
| 2008/0286900 A1 | 11/2008 | Jung |
| 2008/0299759 A1 | 12/2008 | Chatterjee et al. |
| 2008/0299762 A1 | 12/2008 | Mathew et al. |
| 2008/0318361 A1 | 12/2008 | Han et al. |
| 2009/0008790 A1 | 1/2009 | Lee et al. |
| 2009/0051039 A1 | 2/2009 | Kuo et al. |
| 2009/0091962 A1 | 4/2009 | Chung et al. |
| 2009/0124072 A1 | 5/2009 | Park et al. |
| 2009/0127668 A1 | 5/2009 | Choi |
| 2009/0152602 A1 | 6/2009 | Akiyama |
| 2009/0180257 A1 | 7/2009 | Park et al. |
| 2009/0224405 A1 | 9/2009 | Chiou et al. |
| 2009/0239375 A1 | 9/2009 | Riess et al. |
| 2009/0278237 A1 | 11/2009 | Cooney, III et al. |
| 2009/0315154 A1 | 12/2009 | Kirby et al. |
| 2010/0019390 A1 | 1/2010 | Jung |
| 2011/0193226 A1 | 8/2011 | Kirby et al. |
| 2012/0199970 A1 * | 8/2012 | Yun ............. H01L 23/481 257/737 |

FOREIGN PATENT DOCUMENTS

| | | |
|---|---|---|
| TW | 200539244 A | 12/2005 |
| TW | I245379 B | 12/2005 |
| TW | 200821636 A | 5/2008 |

OTHER PUBLICATIONS

Supplementary European Search Report dated Nov. 13, 2014 in European App. No. 11740230.5, 5 pages.
Kurita, Y. et al., A 3D Stacked Memory Integrated on a Logic Device Using SMAFTI Technology, 2007 IEEE Electronic Components and Technology Conference, pp. 821-829, May 29-Jun. 1, 2007, ISBN 1-4244-0985-3.
U.S. Appl. No. 12/545,196, filed Aug. 21, 2009, to Kirby et al.
International Search Report and Written Opinion dated Sep. 16, 2011 in International Application No. PCT/US2011/023150, 7 pages.
Extended European Search Report in European Application No. 11740230.5, dated Mar. 9, 2015, 12 pages.

* cited by examiner

MICROELECTRONIC DEVICES WITH THROUGH-SUBSTRATE INTERCONNECTS AND ASSOCIATED METHODS OF MANUFACTURING

CROSS-REFERENCE TO RELATED APPLICATION

This application is a divisional of U.S. patent application Ser. No. 12/701,800 filed Feb. 8, 2010, now U.S. Pat. No. 8,907,457, which is incorporated herein by reference.

TECHNICAL FIELD

The present technology is directed generally to microelectronic devices with through-substrate interconnects and associated methods of manufacturing.

BACKGROUND

Semiconductor dies typically include a plurality of integrated circuits, bond-pads coupled to the integrated circuits, and metal routing layers for routing electrical signals between the bond-pads and external contacts. Fabricating and packaging such semiconductor dies include forming interconnects to electrically couple the bond-pads and/or metal routing layers to externally devices (e.g., a lead frame, a printed circuit board, etc.).

In some applications, the interconnects extend completely through or through a significant portion of the semiconductor dies (commonly referred to as "through-substrate interconnects"). One conventional process for forming through-substrate interconnects can include forming deep vias on the front and/or back side of a die in alignment with corresponding bond-pads. The vias are then filled with a conductive material (e.g., copper). Solder balls and/or other external electrical contacts are subsequently attached to the through-substrate interconnects.

The through-substrate interconnects may be formed (1) prior to integrating processing (commonly referred to as a "via-first" process), or (2) after the integration processing has been substantially completed (commonly referred to as a "via-last" process). However, both the via-first and via-last processes have certain drawbacks, as discussed in more detail later. Accordingly, several improvements to the process of through-substrate formation may be desirable.

DETAILED DESCRIPTION

Several embodiments of the present technology are described below with reference to processes for forming through vias and conductive routing layers in semiconductor substrates. Many details of certain embodiments are described below with reference to semiconductor dies. The term "semiconductor substrate" is used throughout to include a variety of articles of manufacture, including, for example, individual integrated circuit dies, imager dies, sensor dies, and/or dies having other semiconductor features.

Several of the processes described below may be used to form through vias and conductive routing layers in an individual die or in a plurality of dies, on a wafer or portion of a wafer. The wafer or wafer portion (e.g., wafer form) can include an unsingulated wafer or wafer portion, or a repopulated carrier wafer. The repopulated carrier wafer can include an adhesive material (e.g., a flexible adhesive) surrounded by a generally rigid frame having a perimeter shape that is comparable to that of an unsingulated wafer and can include singulated elements (e.g., dies) surrounded by the adhesive.

Many specific details of certain embodiments are set forth in FIGS. 1-4F and the following text to provide a thorough understanding of these embodiments. Several other embodiments can have configurations, components, and/or processes different from those described below. A person skilled in the relevant art, therefore, will appreciate that additional embodiments may be practiced without several of the details of the embodiments shown in FIGS. 1-4F.

Figure 1:
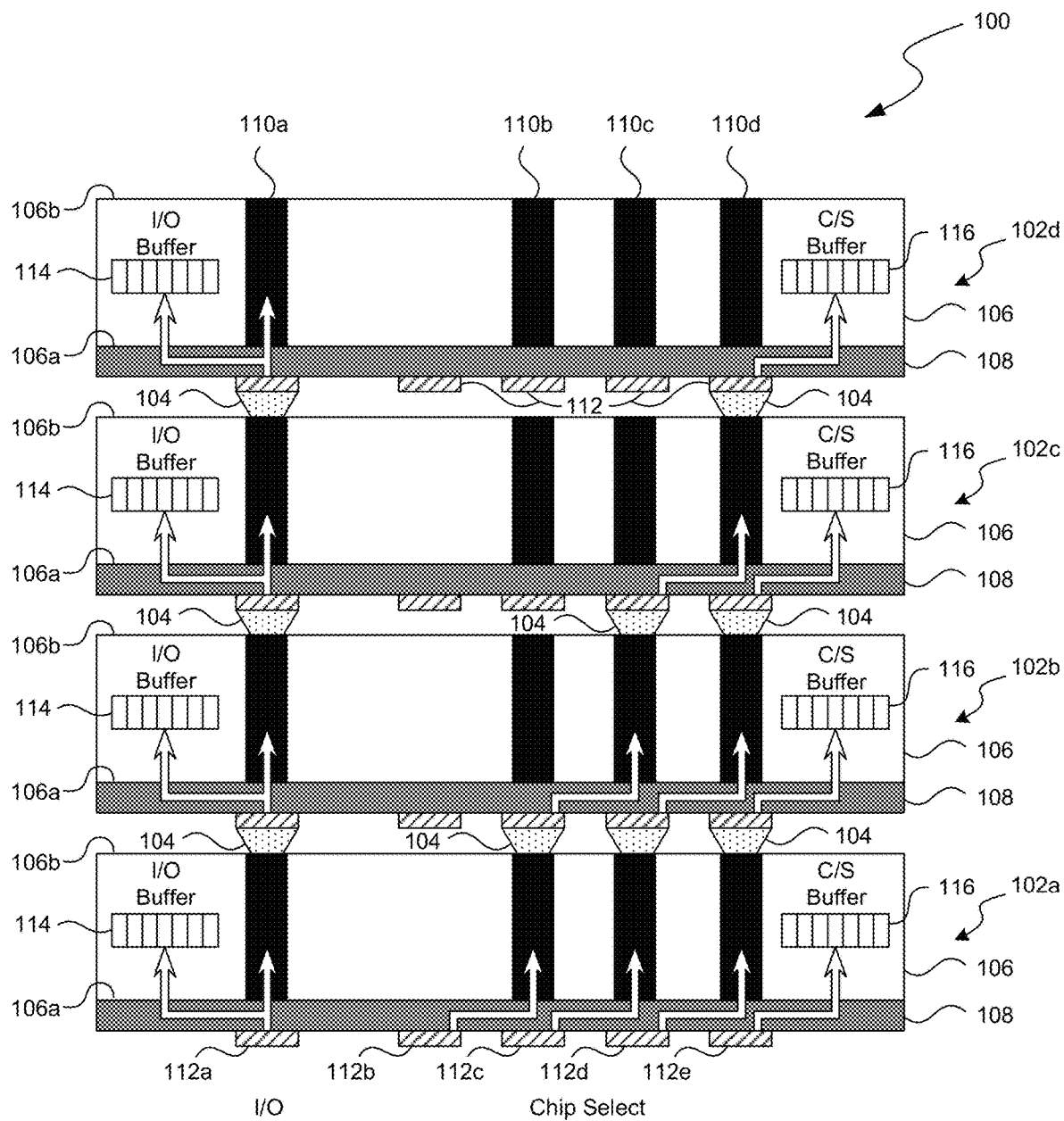
FIG. 1 is a schematic cross-sectional view of a microelectronic package with stacked dies in accordance with embodiments of the technology.

FIG. 1 is a schematic cross-sectional view of a portion of a microelectronic package 100 in accordance with embodiments of the technology. As shown in FIG. 1, the microelectronic package 100 can include a plurality of semiconductor dies 102 stacked in series with a plurality of conductive couplers 104 (e.g., solder balls). Four semiconductor dies 102 (identified individually as first, second, third, and fourth semiconductor dies 102a-102d, respectively) are shown in FIG. 1 for illustration purposes. In other embodiments, the microelectronic package 100 can include any other desired number of semiconductor dies 102 coupled to one another with wirebonds, solder balls, conductive tapes, and/or other suitable electrical connectors.

The semiconductor dies 102 can individually include a semiconductor substrate 106 carrying a signal routing structure 108 proximate to a first side 106a of the semiconductor substrate 106, a plurality of bond-pads 112 (identified individually as first to fifth bond-pads 112a-112e, respectively) on the signal routing structure 108, and a plurality of through-substrate interconnects 110 (identified individually as first to fourth interconnects 110a-110d, respectively) extending between the first side 106a and a second side 106b of the semiconductor substrate 106. The semiconductor dies 102 can also include an input/output ("I/O") buffer 114 associated with the first through-substrate interconnect 110a and a chip-select ("C/S") buffer 116 associated with the second, third, and fourth through-substrate interconnects 110b-110d.

The through-substrate interconnects 110 can be selectively connected to certain metallization layers (not shown in FIG. 1) in the signal routing structures 108 for carrying electrical signals between the first and second sides 106a and 106b of the semiconductor dies 102. Details of several embodiments of a process for forming the signal routing structures 108 and the through-substrate interconnects 110 are discussed in more detail below with reference to FIGS. 2A-4F.

The conductive couplers 104 can interface with corresponding bond-pads 112 based on a desired signal routing scheme. As shown in FIG. 1, not all of the bond-pads 112 are electrically coupled to one of the conductive couplers 104. For example, the first through-substrate interconnect 110a of the first semiconductor die 102a is electrically coupled via the conductive couplers 104 and the first bond-pad 112a of the first semiconductor die 102a. In contrast, the second bond-pad 112b of all the semiconductor dies 102, the third bond-pad 112c of the third semiconductor die 102c, and the third and fourth bond-pads 112c and 112d of the fourth semiconductor die 102d are not electrically coupled to any of the conductive couplers 104. Instead, the signal routing structure 108 routes a chip-select signal (and/or other suitable signals) received at the second bond-pad 112b of the first semiconductor die 102a to the C/S buffer 116 of the fourth semiconductor die 102d via the second through-substrate interconnect 110b of the first semiconductor die 102a, the third through-substrate interconnect 110c of the second semiconductor die 102b, and the fourth through-substrate interconnect 110d of the third semiconductor die 102c.

In operation, the electrically coupled first through-substrate interconnect 110a of the semiconductor dies 102 forms an electrical path for carrying input/output signals to all the semiconductor dies 102. The signal routing structures 108 of the individual semiconductor dies 102 route the input/output signals to the individual I/O buffers 114 of the semiconductor dies 102 from the electrical path. The signal routing structure 108 can also route a chip-select signal (and/or other suitable signals) to a selected semiconductor die 102 to enable processing the input/output signals received at the I/O buffer 114 at a selected semiconductor die 102. For example, the signal routing structure 108 routes a chip-select signal received at the fifth bond-pad 112e to the C/S buffer 116 of the first semiconductor die 102a to enable the first semiconductor die 102a to process the received input/output signals. In another example, the signal routing structure 108 can also route a chip-select signal received at the fourth bond-pad 112d to the second semiconductor die 102b via the fourth through-substrate interconnect 110d of the first semiconductor die 102a.

In accordance with conventional techniques, the through-substrate interconnects 110 may be formed based on a via-first process or a via-last process. However, the inventors have recognized that both the via-first and via-last processes have certain drawbacks. For example, the via-last process may not adequately accommodate routing the chip-select signals because such modification may significantly add cost and/or complexity to the manufacturing process. For example, techniques that may be used to route signals at the last metallization layer can include (1) controlling the formation (or the lack of formation) of conductive bumps to an adjacent semiconductor die 102; (2) routing the signals back down to the lower metallization layers; (3) adding control gates (e.g., MOSFET) to the signal routing structure 108; (4) patterning each of the semiconductor dies 102 differently; and (5) adding a redistribution layer (not shown) on the semiconductor dies 102.

The inventors also recognized that the via-first process may negatively impact the electrical reliability of the semiconductor dies 102 because the electrical contacts between the signal routing structures 108 and integrated circuits (not shown) in the semiconductor dies 102 may be damaged during formation of the signal routing structures 108. Several embodiments of a process for addressing at least some of the foregoing drawbacks of the via-first and via-last processes are discussed below with reference to FIGS. 2A-2N.

Figure 2A:
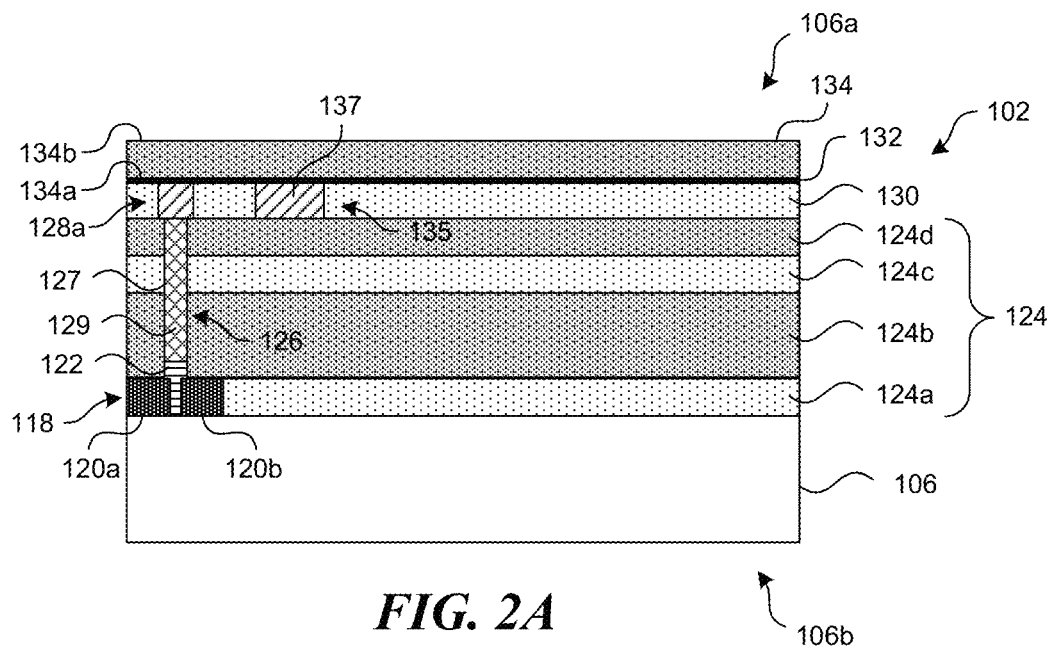
FIGS. 2A-2N are schematic cross-sectional views of a portion of a semiconductor substrate undergoing a process useful for forming several embodiments of the semiconductor dies shown in FIG. 1 in accordance with embodiments of the technology.
Figure 2B:
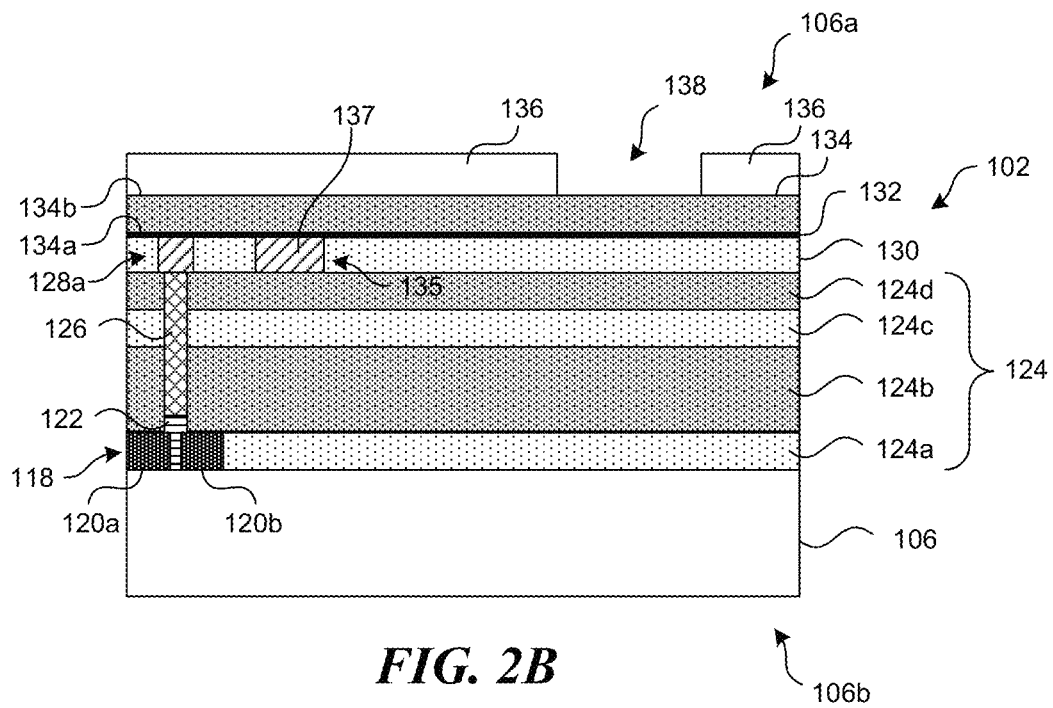
Figure 2C:
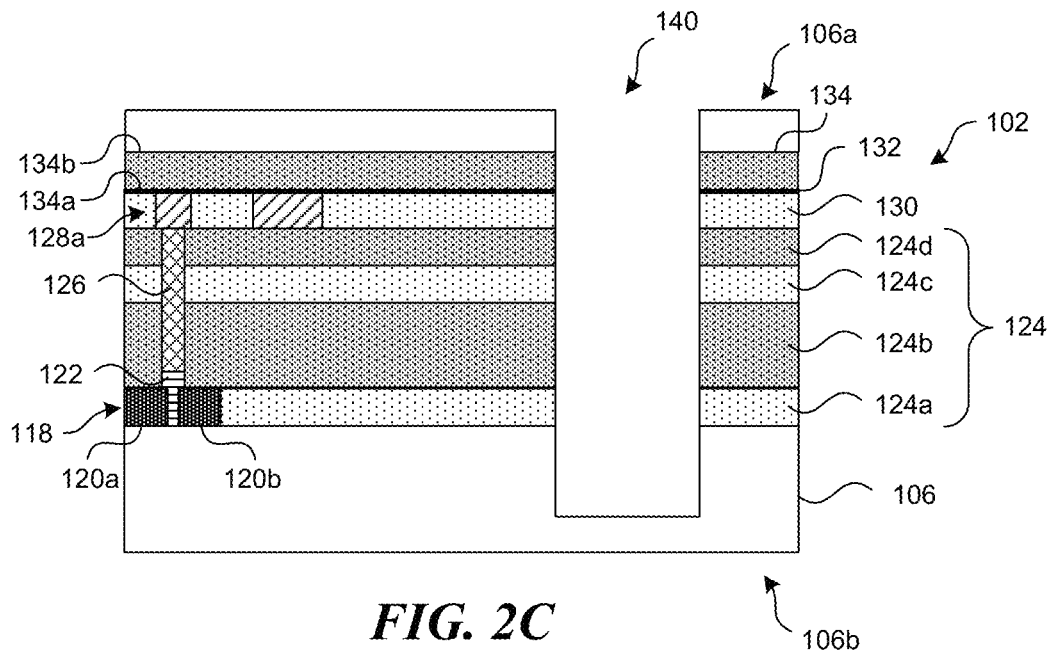
Figure 2D:
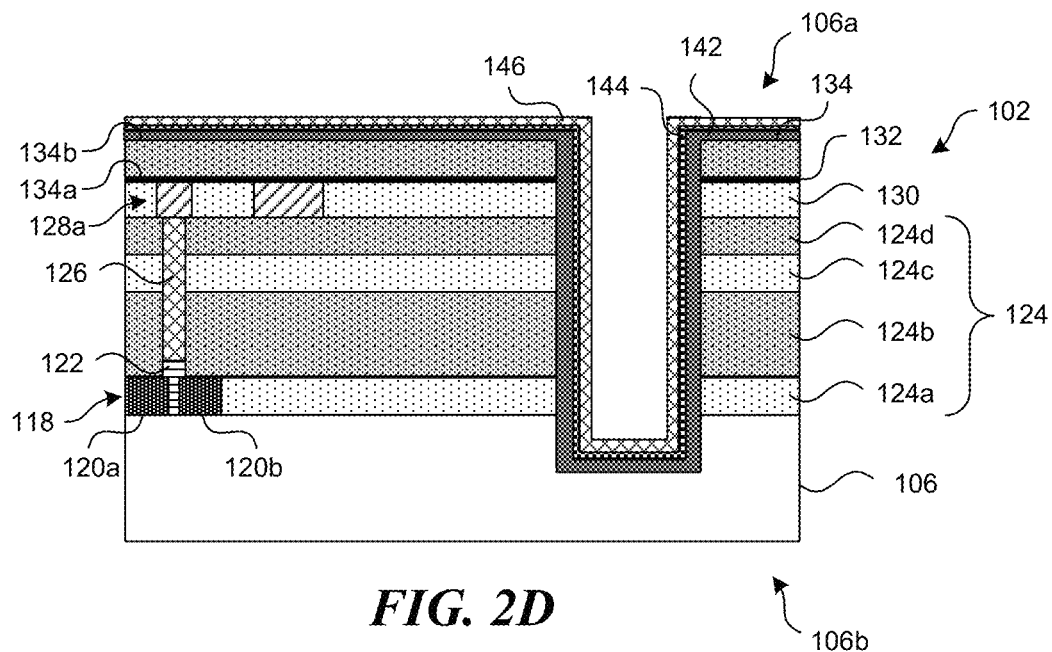
Figure 2E:
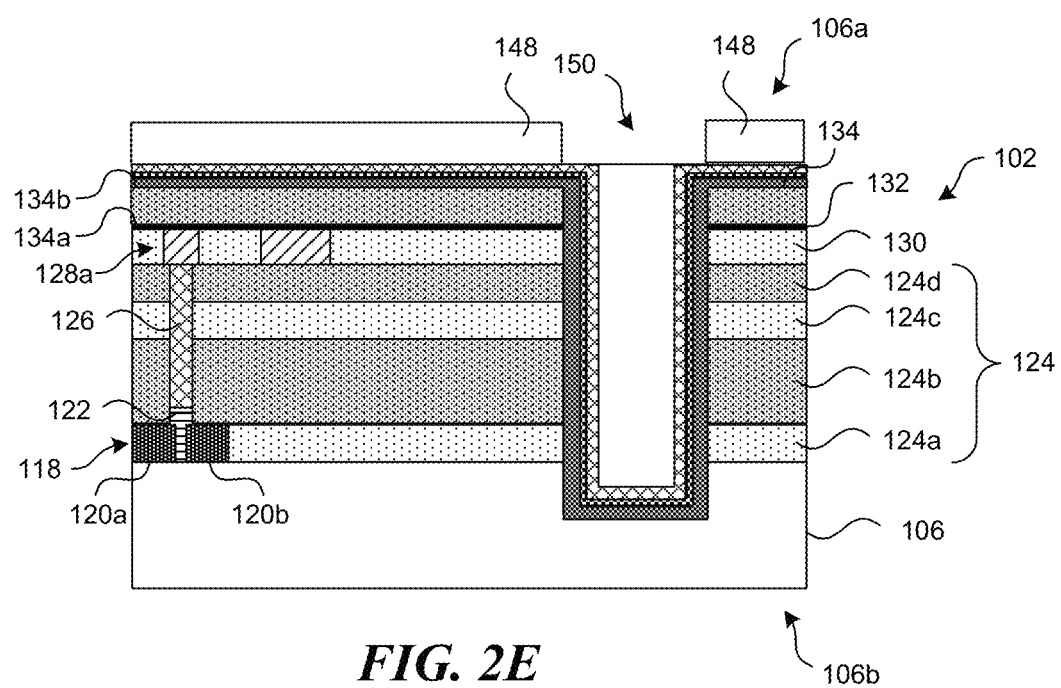
Figure 2F:
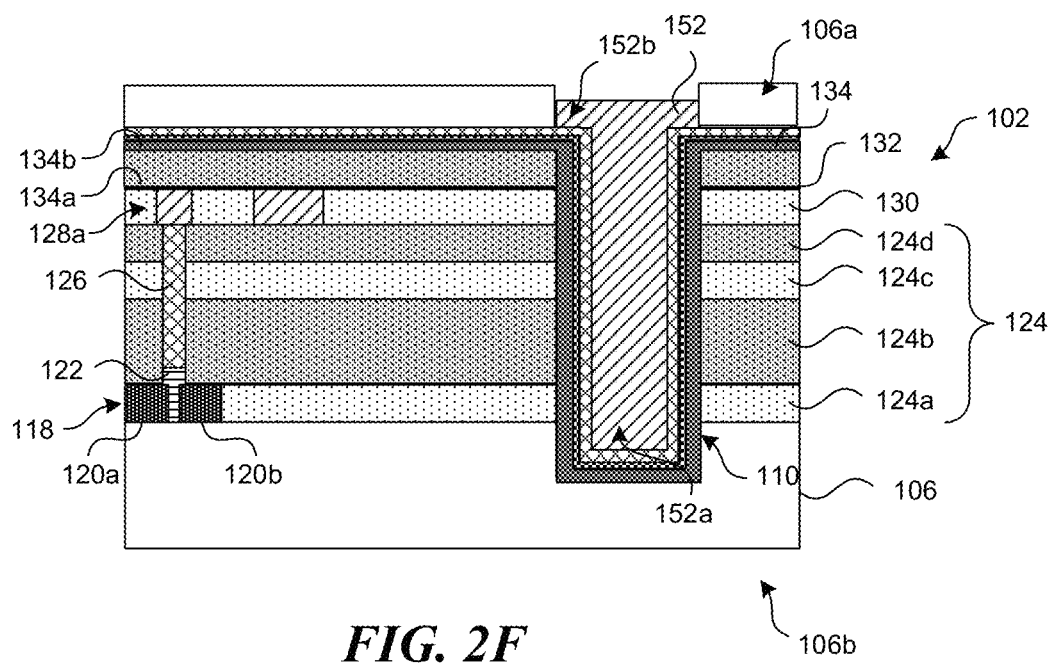
Figure 2G:
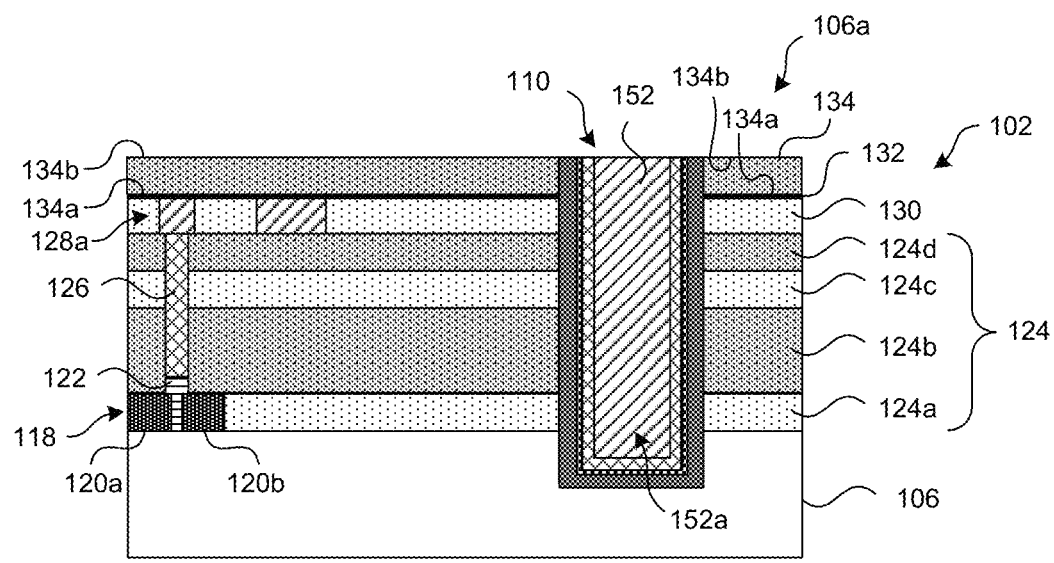
Figure 2H:
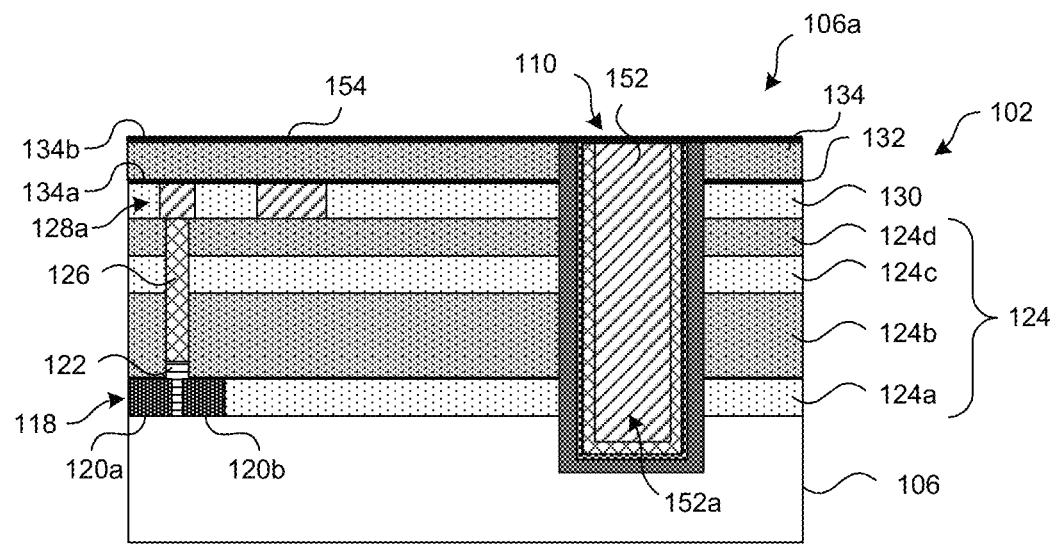
Figure 2I:
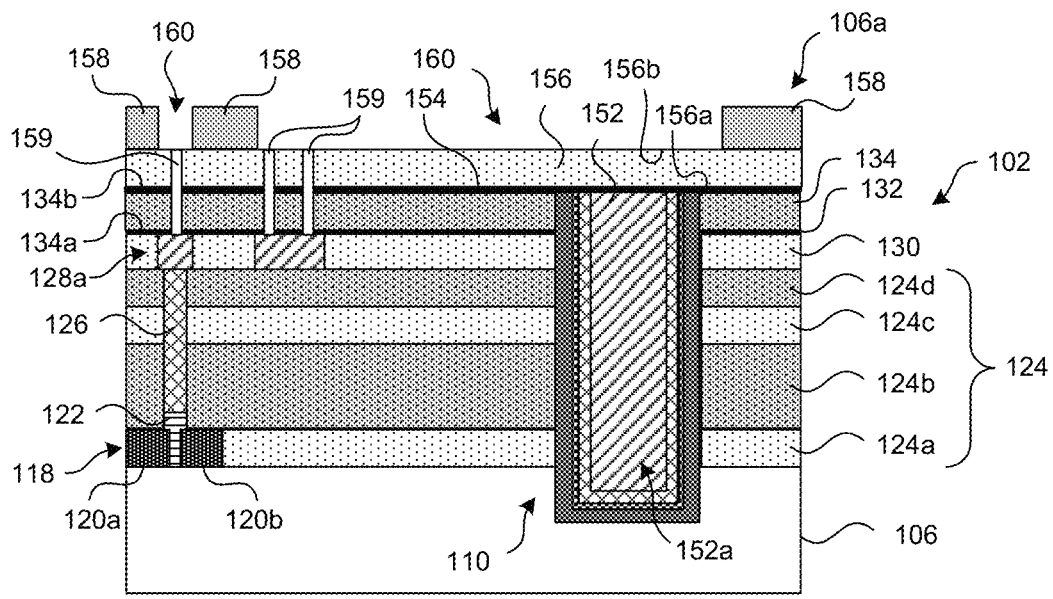
Figure 2J:
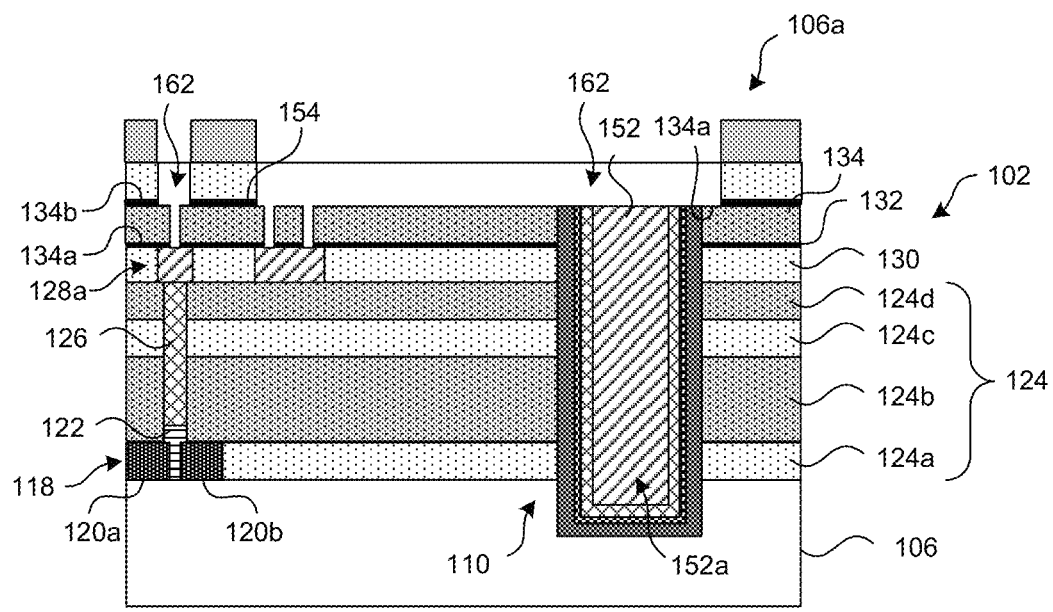
Figure 2K:
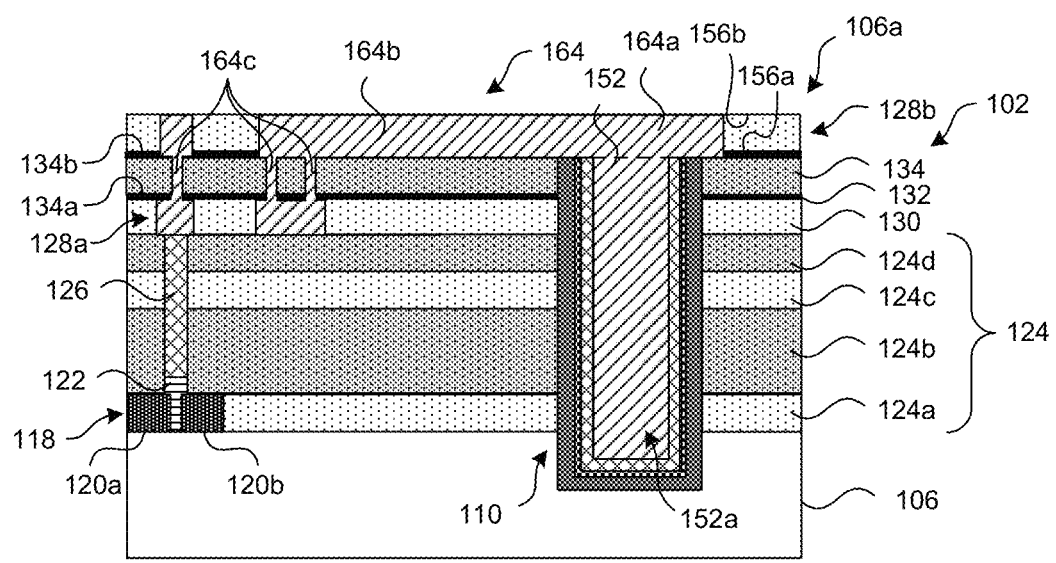
Figure 2L:
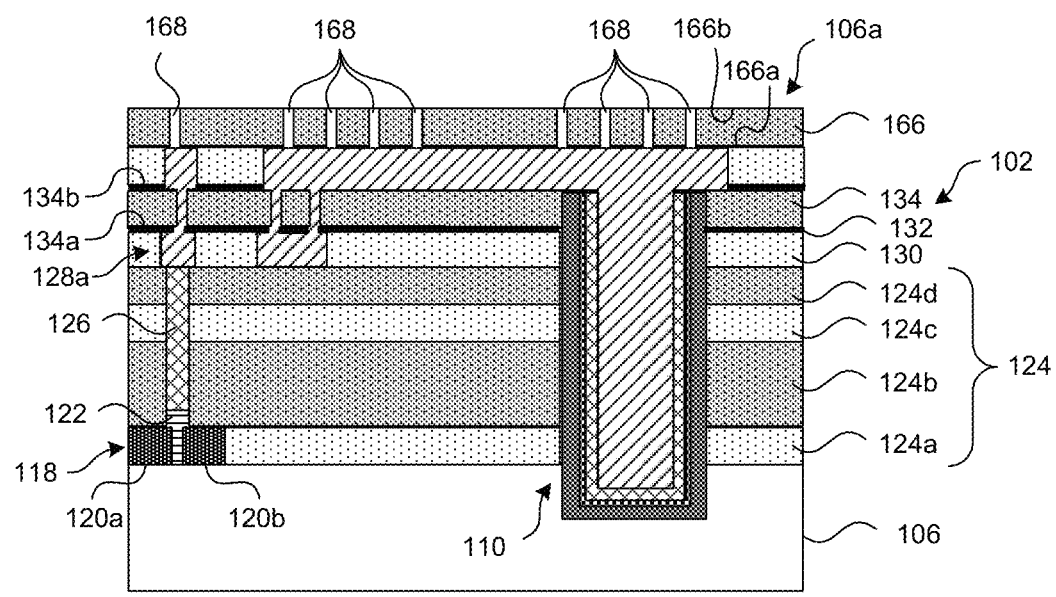
Figure 2M:
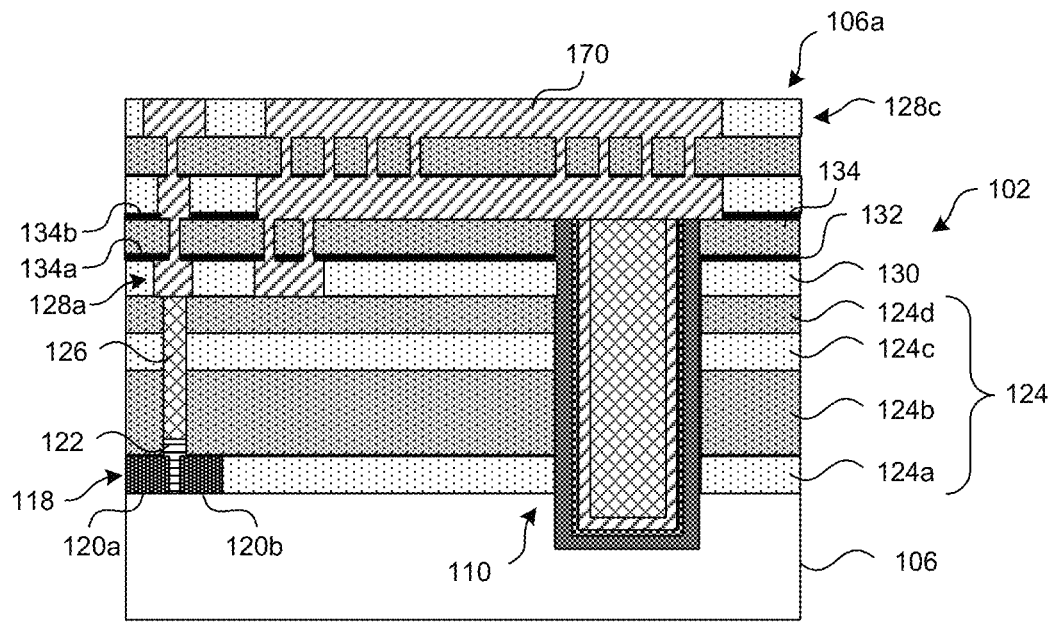
Figure 2N:
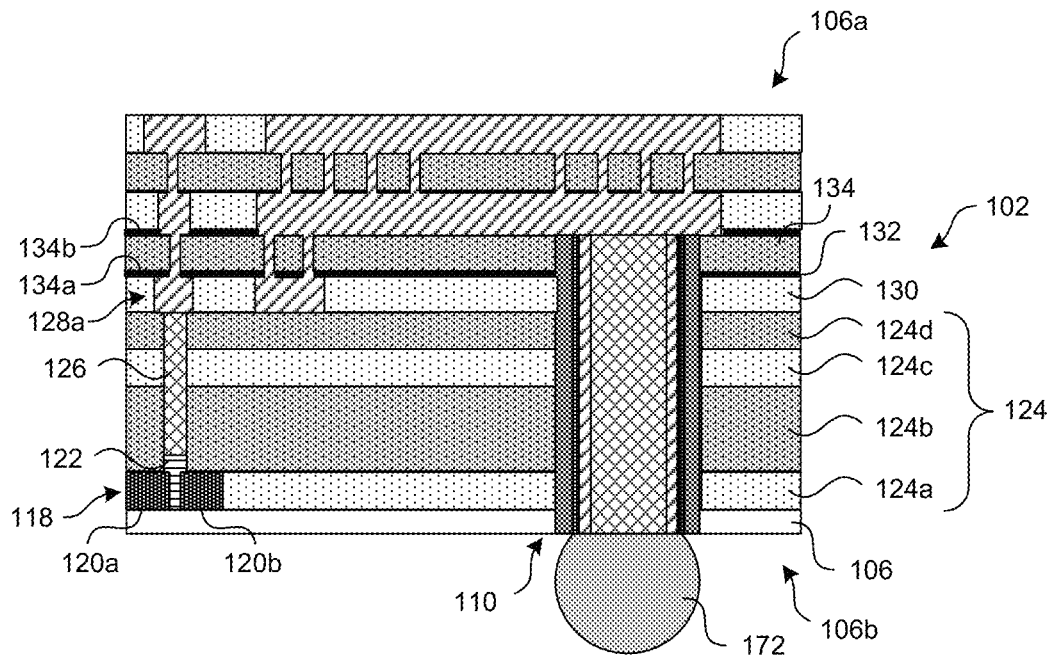

FIGS. 2A-2N are schematic cross-sectional views of a portion of a semiconductor substrate 106 undergoing a process for forming several embodiments of the semiconductor dies 102 shown in FIG. 1 in accordance with embodiments of the technology. In the following description, similar processing operations may utilize generally similar processing techniques. As a result, suitable techniques for performing the processing operations (e.g., patterning a deposited material, removing portions of dielectric materials, depositing a conductive material, etc.) are described only once for brevity.

As shown in FIG. 2A, the process can include forming an integrated circuit 118 in and/or on the first side 106a of the semiconductor substrate 106. In the illustrated embodiment, the integrated circuit 118 is shown schematically as a field-effect transistor having a source 120a, a drain 120b, and a gate 122 for illustration purposes. In other embodiments, the integrated circuit 118 can also include vertical transistors, three-dimensional transistors, capacitors, and/or other suitable electrical components forming a dynamic random access memory (DRAM) and/or other suitable electronic devices.

The process can include forming an insulator 124 on the semiconductor substrate 106. In the illustrated embodiment, the insulator 124 includes four layers of silicon oxide, silicon nitride, and/or other suitable dielectrics (identified individually as first to fourth insulation materials 124a-124d, respectively). In other embodiments, the insulator 124 can also include another desired number of dielectric and/or other suitable insulation materials. Techniques for forming the insulator 124 can include thermal oxidation, chemical vapor deposition ("CVD"), atomic layer deposition ("ALD"), spin-on glass, and/or other suitable techniques.

The process can also include forming a conductive link 126 in the insulator 124 that is electrically connected to the integrated circuit 118. In one embodiment, forming the conductive link 126 includes patterning the insulator 124 with photolithography and/or other suitable techniques, and removing a portion of the patterned insulator 124 to form an aperture 127 via wet etching, dry etching, reactive ion etching, and/or other suitable techniques. The aperture 127 may then be filled with a conductive material 129 (e.g., copper, aluminum, gold, and/or other suitable conductive materials) via physical vapor deposition (PVD), CVD, ALD, electroplating, and/or other suitable techniques. In other embodiments, forming the conductive link 126 may include other processing operations in addition to or in lieu of the foregoing operations.

The process can include forming the first metallization layer 128a by forming a first dielectric 130 on the insulator 124, patterning the first dielectric 130 according to a desired metal routing profile, removing a portion of the first dielectric 130 to form trenches, channels, and/or other openings 135 in the first dielectric 130, and depositing a conductive material 137 (e.g., copper, aluminum, gold, and/or other suitable conductive materials) in the openings 135. The process can then include forming a first barrier 132 (e.g., BLOK provided by Applied Materials, Inc., Santa Clara, Calif.) on the first metallization layer 128a and depositing a second dielectric 134 (e.g., silicon oxide) on the first barrier 132. The second dielectric 134 includes a first surface 134a proximate to the first barrier 132 and a second surface 134b opposite the first surface 134a.

After forming the first metallization layer 128a, FIGS. 2B-2H illustrate a through-substrate interconnect formation process module (hereinafter referred to as the "TSV module") for forming a through-substrate interconnect 110 (FIG. 1) in the semiconductor substrate 106. As shown in FIG. 2B, the TSV module can include depositing a first photoresist 136 on the second dielectric 134 via spin coating and/or other suitable techniques. The first photoresist 136 can then be patterned to form a first opening 138. As used herein, the term "photoresist" generally refers to a material that can be chemically modified when exposed to electromagnetic radiation. The term encompasses both positive photoresist that is configured to be soluble when activated by the electromagnetic radiation and negative photoresist that is configured to be insoluble when activated by light.

As shown in FIG. 2C, the TSV module can include forming an interconnect aperture 140 in the semiconductor substrate 106. The interconnect aperture 140 can be formed by removing material from the first dielectric 130, the first barrier 132, the second dielectric 134, the insulator 124, and at least a portion of the semiconductor substrate 106 via the opening 138 in a continuous operation. In other embodiments, forming the interconnect aperture 140 can include a first material removal operation (e.g., using wet etching) to remove a portion of the first dielectric 130, the first barrier 132, the second dielectric 134, and the insulator 124, and a second material removal operation (e.g., using reactive ion etching) to remove a portion of the semiconductor substrate 106.

As shown in FIG. 2D, the TSV module can further include removing the first photoresist 136 and sequentially forming an aperture insulator 142, an aperture barrier 144, and a seed material 146 in the interconnect aperture 140. The aperture insulator 142 can include silicon oxide, silicon nitride, and/or other suitable insulation materials formed via thermal oxidation, CVD, ALD, and/or other suitable techniques. The aperture barrier 144 can include tantalum (Ta), tungsten (W), titanium nitride (TiN), and/or other suitable barrier materials formed via pulsed chemical vapor deposition ("pCVD"), ionic physical vapor deposition ("iPVD"), ALD, and/or other suitable techniques. The seed material 144 can include copper, tungsten, and/or other suitable conductive materials deposited via pCVD, iPVD, ALD, and/or other suitable techniques.

As shown in FIG. 2E, the TSV module can also include depositing a second photoresist 148 on the seed material 146. The second photoresist 148 can then be patterned to form a second opening 150. As shown in FIG. 2F, the TSV module can include filling the interconnect aperture 140 with a first conductive material 152 via the second opening 150 to form the through-substrate interconnect 110. The first conductive material 152 includes a first portion 152a in the interconnect aperture 140 and a second portion 152b extending beyond the second dielectric 134. The first conductive material 152 can include copper, aluminum, tungsten, gold, and/or alloys of the foregoing constituents. In particular embodiments, the first conductive material 152 includes electrolytic copper introduced into the interconnect aperture 140. The electrolytic copper has an enhanced purity when compared to electrolessly disposed materials, and when compared to solder. For example, the first conductive material 152 can be at least 90% copper and in some cases 99% copper. The second photoresist 148 may then be removed.

As shown in FIG. 2G, the second portion 152b (FIG. 2F) of the first conductive material 152 can be subsequently removed such that the first portion 152a of the first conductive material 152 is generally planar with the second surface 134b of the second dielectric 134. Techniques for removing the second portion 152b of the first conductive material 152 can include chemical-mechanical polishing ("CMP"), electrochemical-mechanical polishing ("ECMP"), and/or other suitable techniques. As shown in FIG. 2H, the TSV module can optionally include depositing a second barrier 154 (e.g., BLOK provided by Applied Materials, Inc., Santa Clara, Calif.) on the second surface 134b of the second dielectric 134 and the first portion 152a of the first conductive material 152. In other embodiments, depositing the second barrier 154 may be omitted.

Even though the TSV module discussed above includes depositing and patterning the second photoresist 148, in certain embodiments, the second photoresist 148 may be omitted. Instead, the TSV module can include depositing the first conductive material 152 with the first portion 152a in the interconnect aperture 140 and the second portion 152b substantially covering the second surface 134b of the second dielectric 134. Subsequently, at least a part of the second portion 152b may be removed to yield the through-substrate interconnect 110 as shown in FIG. 2G.

Following the TSV module, the process can include forming a second metallization layer. As shown in FIG. 2I, the process can include forming a third dielectric 156 on the optional second barrier 154. The third dielectric 156 includes a first surface 156a proximate to the optional second barrier 154 and a second surface 156b opposite the first surface 156a. Then, a plurality of first vias 159 to the first metallization layer 128a may be formed through the third dielectric 156, the optional second barrier 154, and the second dielectric 134.

The process can then include depositing a third photoresist 158 on the third dielectric 156 and patterning the third photoresist 158 to form third openings 160 corresponding to a desired routing profile for a second metallization layer 128b (not shown). As shown in FIG. 2J, the process can include removing a portion of the third dielectric 156 and optionally a portion of the second barrier 154 to form openings 162. The openings 162 expose at least a part of the second surface 134b of the second dielectric 134 and the upper surface of the first portion 152a of the first conductive material 152.

As shown in FIG. 2K, the process can include filling the openings 162 and first vias 159 with a second conductive material 164 and subsequently removing excess second conductive material 164 external to the openings 162 such that the second conductive material 164 is generally planar with the second surface 156b of the third dielectric 156. In the illustrated embodiment, the second conductive material 164 includes a first portion 164a, a second portion 164b extending laterally away from the first portion 164a, and a third portion 164c in the first vias 159. The first portion 164a of the second conductive material 164 is in direct physical contact with the first portion 152a of the first conductive material 152 of the through-substrate interconnect 110. The third portion 164c of the second conductive material 164 electrically connects the second portion 164b and the first metallization layer 128a.

In one embodiment, the second conductive material 164 includes the same composition (e.g., copper) as the first conductive material 152. As a result, the first and second conductive materials 152 and 164 may be generally homogeneous (a phantom line is used in FIG. 2K to show an artificial demarcation between the first and second conductive materials 152 and 164). In other embodiments, the second conductive material 164 may include a composition at least partially different than the first conductive material 152. As a result, the first metallization layer 128a is electrically connected to the through-substrate interconnect 110 via the second conductive material 164.

After forming the second metallization layer 128b, the process can include forming additional metallization layers on the semiconductor substrate 106. For example, FIGS. 2L and 2M illustrate operations of forming a third metallization layer 128c. As shown in FIG. 2L, the process can include depositing a fourth dielectric 166 on the second surface 156b of the third dielectric 156 and the second metallization layer 128b. The deposited fourth dielectric 166 has a first surface 166a proximate to the third dielectric 156 and a second surface 166b opposite the first surface 166a. The process can then include patterning and removing a portion of the fourth dielectric 166 to form a plurality of second vias 168 extending from the second surface 166b of the fourth dielectric 166 to the second metallization layer 128b.

The third metallization layer 128c can then be formed following operations generally similar to those described with reference to FIGS. 2I and 2J. As shown in FIG. 2M, the third metallization layer 128c includes a third conductive material 170 electrically connected to the second metallization layer 128b via the second vias 168. In the illustrated embodiment, the third conductive material 170 has the same composition (e.g., copper) as the first and second conductive materials 152 and 164. In other embodiments, the third dielectric material 170 may have a composition different from the first and/or second dielectric materials 152 and 164.

In certain embodiments, the process can also include processing the semiconductor substrate 106 to form additional features in and/or on the semiconductor substrate 106. For example, as shown in FIG. 2N, a portion of the semiconductor substrate 106 can be removed from the second side 106b using a mechanical or chemical-mechanical technique to expose the through-substrate interconnect 110. A conductive component 172 (e.g., a conductive pillar, a solder ball, a solder bump, a redistribution layer, a through-silicon via stud, and/or other suitable interconnect devices) can then be attached to the through-substrate interconnect 110 for interconnecting with an external component (not shown).

Even though only first, second and third metallization layers 128a, 128b, and 128c are illustrated in FIGS. 2A-2M, in certain embodiments, the process can include forming four, five, or any desired number of metallization layers by repeating at least some of the operations discussed above with reference to FIGS. 2L and 2M. In these embodiments, the through-substrate interconnect 110 may be electrically connected to the second metallization layer 128b, the third metallization layer 128c, or the N-1 metallization layer (not shown).

Several embodiments of the foregoing process can reduce the risk of damaging the electrical connection between the first metallization layer 128a and the conductive link 126. The inventors have observed that forming the through-substrate interconnect 110 before forming the first metallization layer 128a can result in a defective electrical connection between the first metallization layer 128a and the conductive link 126. Without being bound by theory, it is believed that several operations during the formation of the first metallization layer 128a (e.g., deposition of the conductive material, removal of excess conductive material, etc.) may physically weaken and/or damage the electrical connection between the first metallization layer 128a and the conductive link 126. As a result, by forming the through-substrate interconnect 110 subsequent to forming the first metallization layer 128a, the risk of creating a defective electrical connection may be lowered.

Several embodiments of the foregoing process can also be more cost-effective and flexible when compared to conventional techniques. For example, the selection of electrical connection between the through-substrate interconnect 110 and the metallization layers may be postponed until later processing stages than the via-first process. As a result, the number of generic intermediate products (i.e., semiconductor dies with partially formed metallization layers) may be increased to enable a production manager to continue producing the semiconductor dies 102 before making a decision concerning the final connection configuration of the semiconductor dies 102.

Figure 3A:
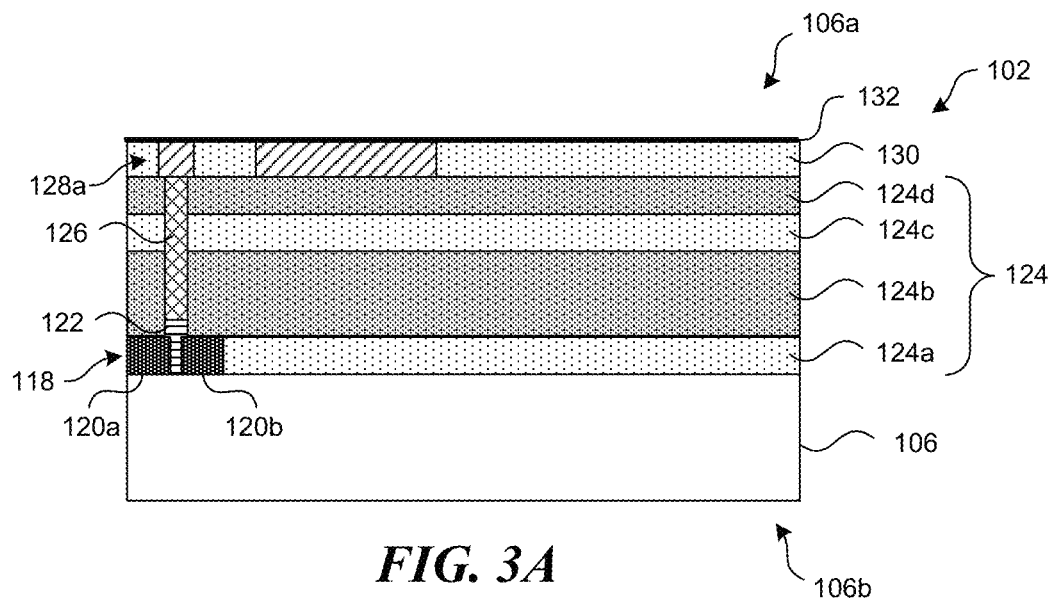
FIGS. 3A-3F are schematic cross-sectional views of a portion of a semiconductor substrate undergoing a process useful for forming several embodiments of the semiconductor dies shown in FIG. 1 in accordance with additional embodiments of the technology.

Even though specific operations are discussed above with reference to FIGS. 2A-2N for forming and connecting the second metallization layer 128b to the through-substrate interconnect 110, in other embodiments, the second metallization layer 128b may be formed and connected to the through-substrate interconnect 110 with additional and/or different process operations. For example, FIGS. 3A-3F are schematic cross-sectional views of a portion of a semiconductor substrate undergoing a process useful for forming several embodiments of the semiconductor dies 102 shown in FIG. 1 in accordance with additional embodiments of the technology. As shown in FIG. 3A, the process can include forming the integrated circuit 118 in and/or on the semiconductor substrate 106, forming the conductive link 126, the first metallization layer 128a, and the first barrier 132 on the first metallization layer 128a, as discussed above with reference to FIG. 2A.

Figure 3B:
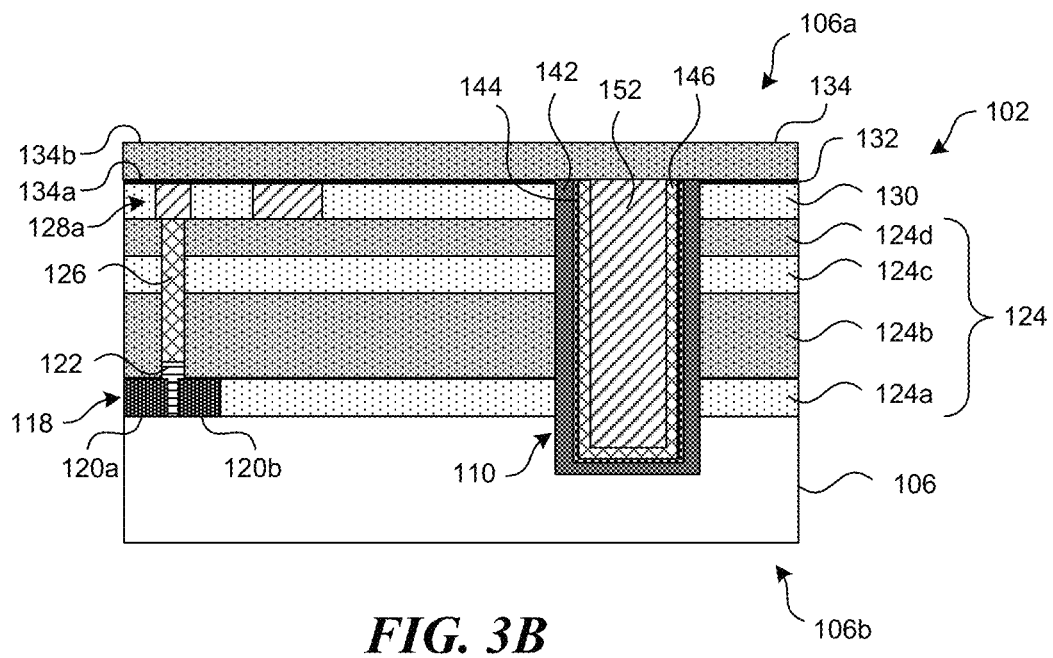

Unlike the embodiment shown in FIG. 2A, the process shown in FIG. 3B can include utilizing the TSV module, as discussed above with reference to FIGS. 2B-2H, before depositing the second dielectric 134 on the first barrier 132. Subsequently, the second dielectric 134 may be formed on the first barrier 132 and the through-substrate interconnect 110. As a result, the through-substrate interconnect 110 may be generally planar with the first barrier 132 and may be in direct contact with the first surface 134a of the second dielectric 134.

Figure 3C:
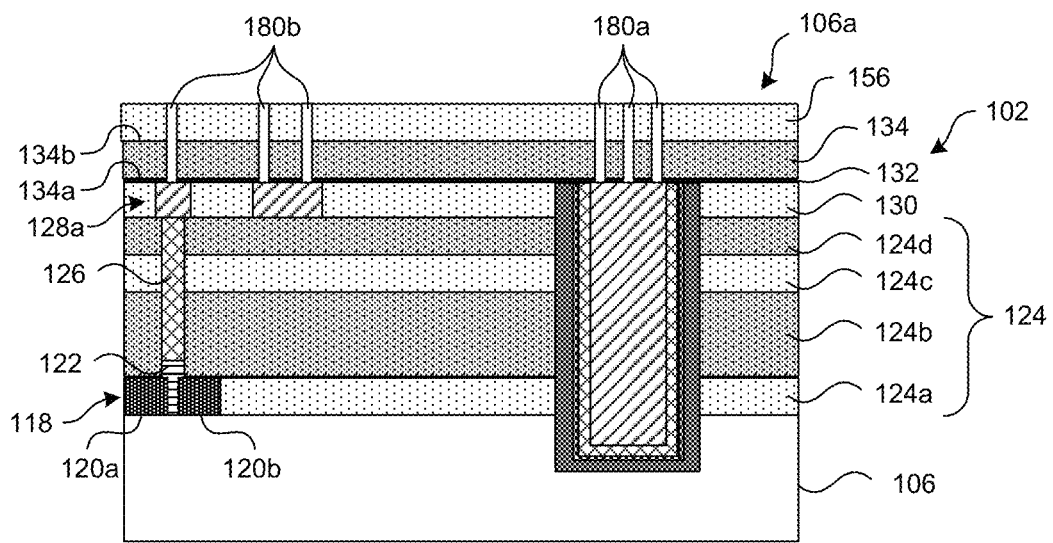
Figure 3D:
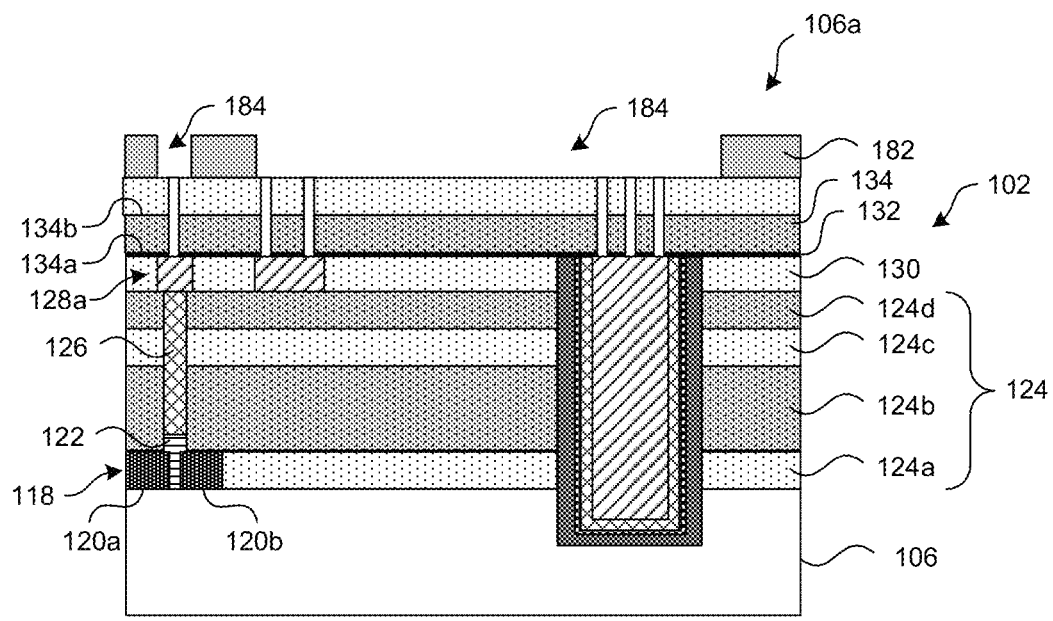

As shown in FIG. 3C, the process can include depositing the third dielectric 156 on the second dielectric 134. As a result, the first surface 156a of the third dielectric 156 can be in direct contact with the second surface 134b of the second dielectric 134. The process can include forming a plurality of access vias 180 in the second and third dielectrics 134 and 156 through the third dielectric 156, the second dielectric 134, and the barrier 132. The access vias 180 include (1) a first group 180a of access vias 180 that generally correspond to the through-substrate interconnect 110; and (2) a second group 180b of access vias 180 that generally correspond to the first metallization layer 128a.

Figure 3E:
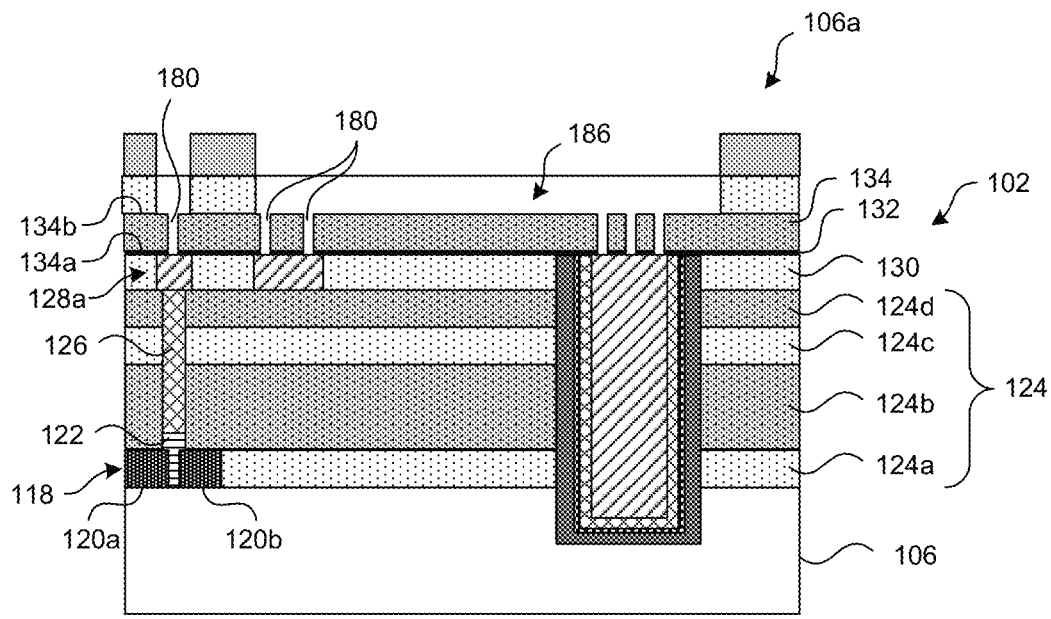

The process can then include depositing a photoresist 182 on the third dielectric 156 and patterning the photoresist 182 to form openings 184 corresponding to a desired routing profile for the second metallization layer 128b. As shown in FIG. 3E, the process can include removing a portion of the third dielectric 156 to form openings 186. The openings 186 expose at least a part of the second surface 134b of the second dielectric 134 and are in communication with at least some of the access vias 180.

Figure 3F:
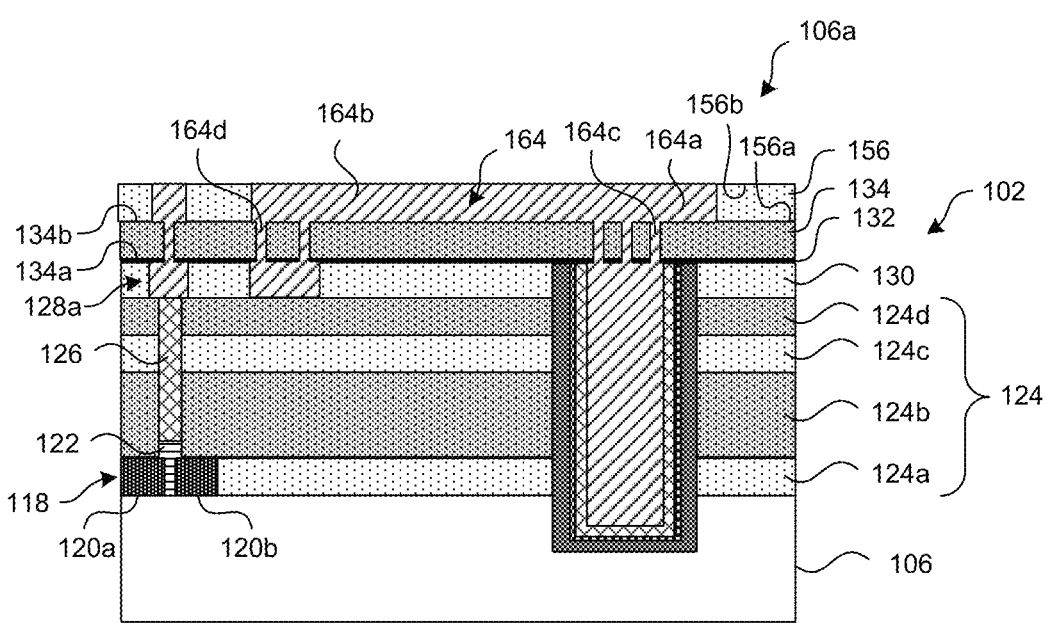

As shown in FIG. 3F, the process can include filling the openings 186 and the access vias 180 with the second conductive material 164. Excess second conductive material 164 external to the openings 186 may then be removed such that the second conductive material 164 is generally planar with the second surface 156b of the third dielectric 156. The second conductive material 164 includes a first portion 164a, a second portion 164b extending laterally away from the first portion 164a, a third portion 164c in the first group 180a of the access vias 180, and a fourth portion 164d in the second group 180b of the access vias 180. The third portion 164c of the second conductive material 164 electrically connects the first portion 164a of the second conductive material 164 to the through-substrate interconnect 110. The fourth portion 164d of the second conductive material 164 electrically connects the second portion 164b of the second conductive material 164 to the first metallization layer 128a. The process can then include forming additional metallization layers and performing subsequent processing as discussed with reference to FIGS. 2L-2N.

Figure 4A:
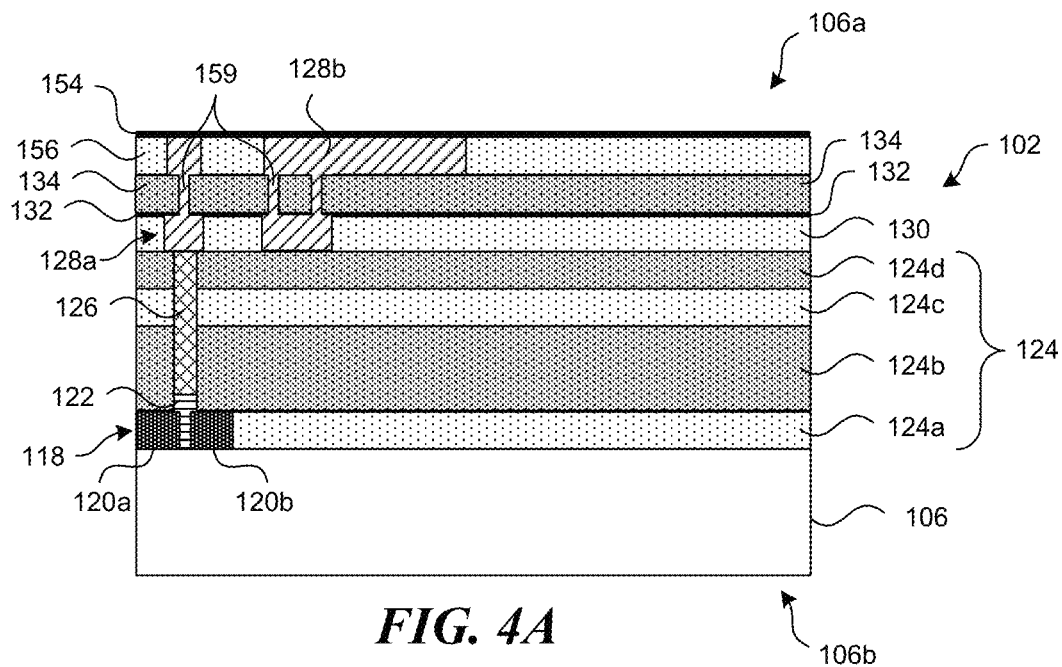
FIGS. 4A-4F are schematic cross-sectional views of a portion of a semiconductor substrate undergoing a process useful for forming several embodiments of the semiconductor dies shown in FIG. 1 in accordance with yet additional embodiments of the technology.

FIGS. 4A-4F are schematic cross-sectional views of a portion of a semiconductor substrate 100 undergoing a process useful for forming several embodiments of the semiconductor dies 102 shown in FIG. 1 in accordance with yet additional embodiments of the technology. As shown in FIG. 4A, the process can include forming the integrated circuit 118 in and/or on the semiconductor substrate 106, forming the conductive link 126, the first metallization layer 128a, and the first barrier 132 on the first metallization layer 128a, as discussed above with reference to FIG. 2A. The process can also include forming the second metallization layer 128b, as discussed above with reference to FIGS. 2H-2K. The process can then optionally include depositing the second barrier 154 on the second metallization layer 128b.

Figure 4B:
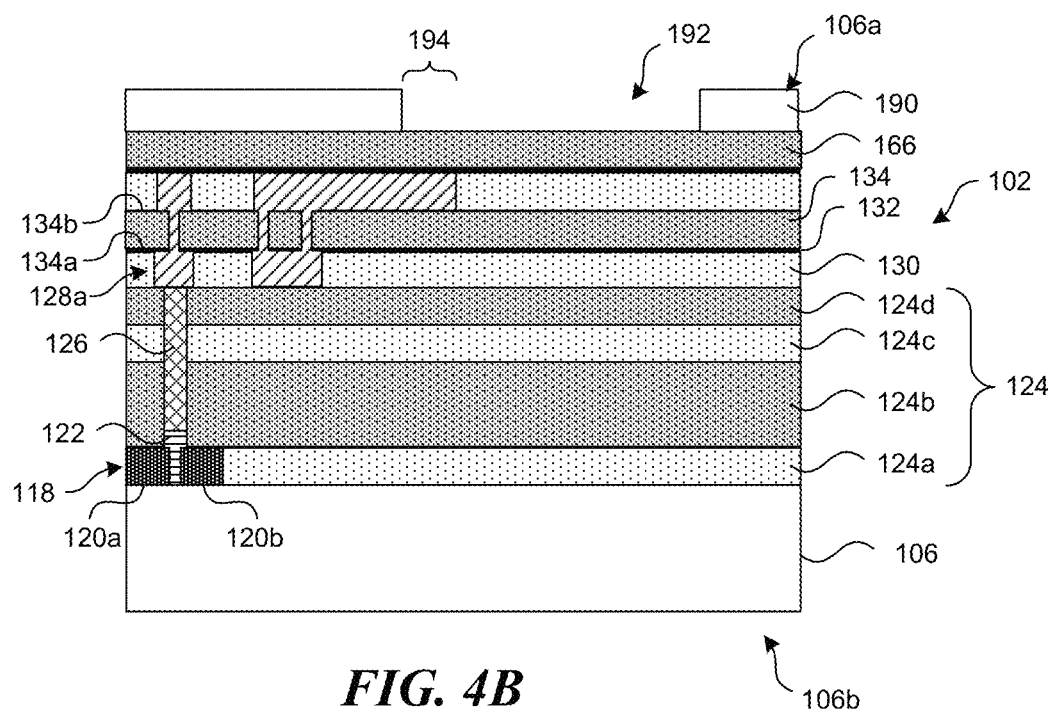

As shown in FIG. 4B, the process can include forming the fourth dielectric 166 on the second barrier 154 and depositing a photoresist 190 on the fourth dielectric 166. The photoresist 190 can then be patterned to form openings 192 corresponding to a portion of the second metallization layer 128b and the through-substrate interconnect 110 (not shown). As a result, a portion of the fourth dielectric 166 and the underlying second barrier 154 is exposed in the opening 192 (hereinafter referred to as the exposed portion 194).

Figure 4C:
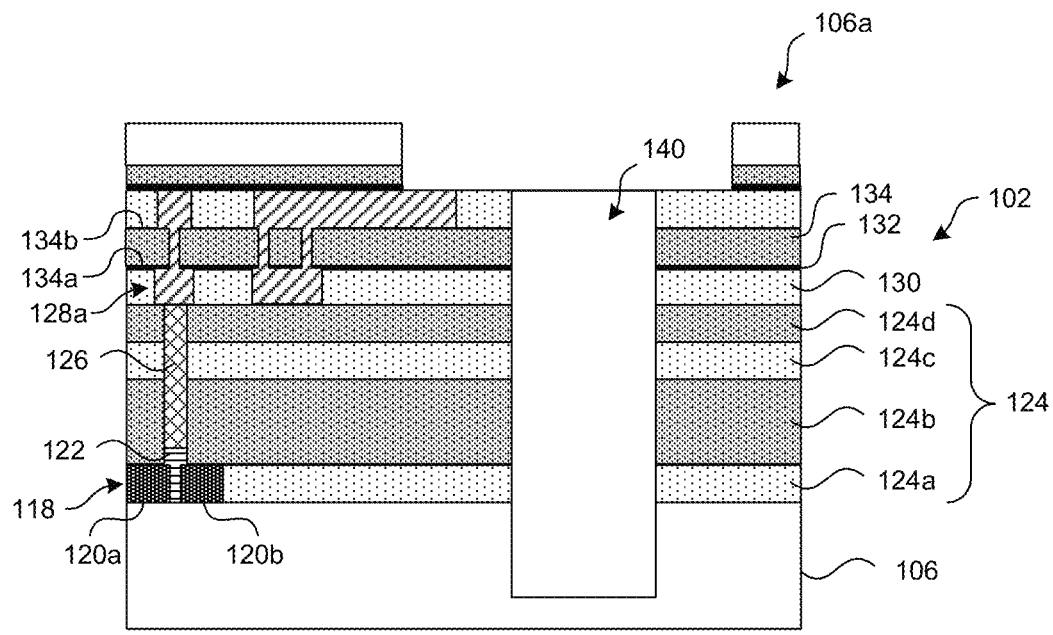

As shown in FIG. 4C, the process can include forming the interconnect aperture 140 in the semiconductor substrate 106 and removing the exposed portion 194 (FIG. 4B). In one embodiment, the interconnect aperture 140 may be formed and the exposed portion 194 may be removed in one continuous operation using a phase-shift mask, leaky-chrome mask, and/or other suitable techniques. In another embodiment, the interconnect aperture 140 may be formed by etching with a first mask (not shown) generally corresponding to the interconnect aperture 140. The exposed portion 194 may be removed with a second mask (not shown) generally corresponding to the exposed portion 194. In other embodiments, the exposed portion 194 may be removed via other suitable techniques.

Figure 4D:
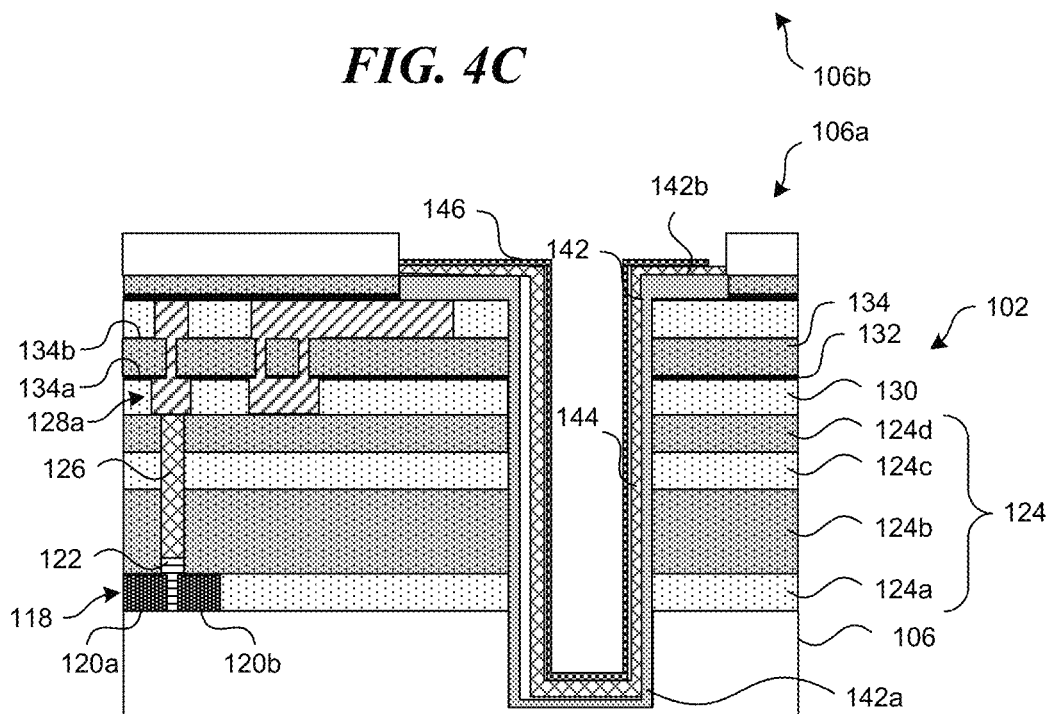

As shown in FIG. 4D, the process can include forming the aperture insulator 142 in the interconnect aperture 140. In the illustrated embodiment, the aperture insulator 142 includes a first portion 142a in the interconnect aperture 140 and a second portion 142b external to the interconnect aperture 140. The second portion 142b at least partially overlaps and is in direct contact with the second metallization layer 128b. In other embodiments, the aperture insulator 142 may only include the first portion 142a by using, for example, a photomask generally corresponding to the interconnect aperture 140 that was used when forming the aperture insulator 142.

Figure 4E:
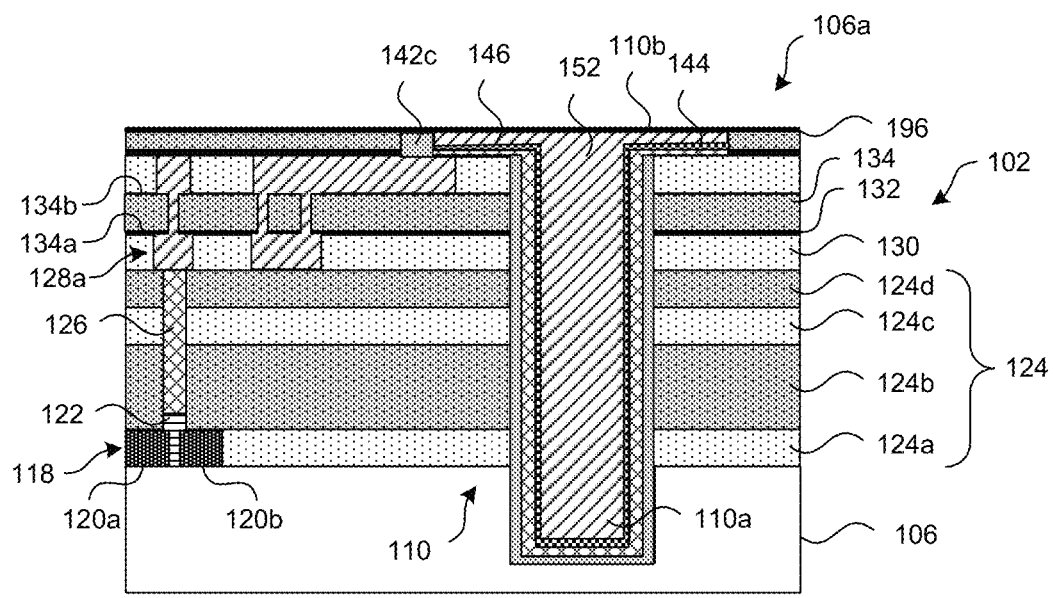

As shown in FIG. 4E, the process can include at least partially removing the second portion 142b of the aperture insulator 142 and exposing the second metallization layer 128b. In one embodiment, the second portion 142b may be partially removed via a spacer etch. As a result, a part 142c of the second portion 142b remains on the second metallization layer 128b. In other embodiments, the second portion 142b may be partially removed via laser ablation and/or other suitable techniques. In further embodiments, the second portion 142b may be completely removed.

The process can then include depositing the aperture barrier 144 and the seed material 146 in the interconnect aperture 140, as discussed above with reference to FIG. 2C. Then, the process can include filling the interconnect aperture 140 with the first conductive material 152, and removing excess first conductive material 152 from the fourth dielectric 166.

Figure 4F:
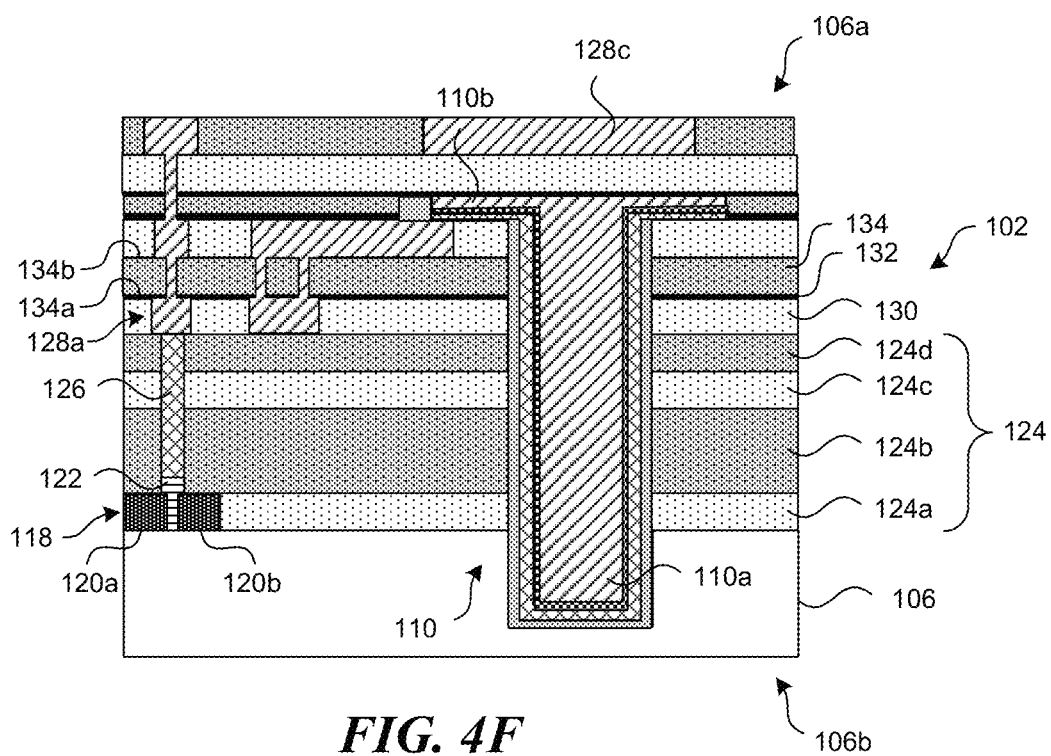

As shown in FIG. 4F, the through-substrate interconnect 110 includes a vertical section 110a in the interconnect aperture 140 and a horizontal section 110b external to the interconnect aperture 140. The horizontal section 110b extends laterally toward the second metallization layer 128b such that at least a portion of the horizontal section 110b is in direct contact with a top surface of the second metallization layer 128b. The process can optionally include forming a third barrier 196 on the fourth dielectric 166 and the through-substrate interconnect 110. The process can then include forming additional metallization layers and performing subsequent processing as discussed with reference to FIGS. 2L-2N to yield the semiconductor die 102 shown in FIG. 4E.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the technology is not limited except as by the appended claims.

We claim:

1. A method for fabricating a semiconductor device, comprising:
    forming a first metallization layer and a second metallization layer on a semiconductor substrate, the second metallization layer being in electrical contact with the first metallization layer by a first via in a dielectric layer vertically spaced apart the first metallization layer and the second metallization layer;
    forming an interconnect aperture at least partially in the semiconductor substrate after the first metallization layer is formed;
    forming an aperture insulator portion on a top surface of the second metallization layer, the aperture portion insulator having a first lateral dimension smaller than a second lateral dimension of the second metallization layer, the aperture insulator portion being formed at a location that laterally divides the second metallization layer into a contact portion and a non-contact portion, the contact portion being substantively smaller than the non-contact portion, the contact portion and the non-contact portion being defined by a side of the aperture insulator portion; and
    filling the interconnect aperture with a conductive material to form a conductive interconnect extending at least partially through the semiconductor substrate, wherein the conductive interconnect includes a vertical section in the interconnect aperture and a horizontal section external to the interconnect aperture, and wherein the horizontal section includes a substantially-planar bottom surface, and wherein the horizontal section extends laterally toward the second metallization layer such that a portion of the substantially-planar bottom surface of the horizontal section is in physical contact with the top surface of the contact portion of the second metallization layer at a first horizontal location, and wherein the non-contact portion is electrically coupled to the first metallization layer at a second horizontal location different from the first horizontal location, and wherein the second metallization layer is in electrical contact with the conductive interconnect, and wherein the side of the aperture insulator portion faces the vertical section of the conductive interconnect, and wherein the first via is vertically aligned with the non-contact portion, and wherein the contact portion of the second metallization layer extends vertically from an upper surface of the dielectric layer to a lower surface of the horizontal section of the conductive interconnect.

2. The method of claim 1 wherein:
the conductive material is a first conductive material; and
forming an interconnect aperture includes:
   depositing a dielectric on the second metallization layer;
   forming the interconnect aperture through the dielectric and the semiconductor substrate;
   exposing at least a portion of the second metallization layer; and
   depositing a second conductive material in the interconnect aperture and onto the exposed portion of the second conductive material.

3. A method for fabricating a semiconductor device, comprising:
   forming a plurality of metallization layers carried by a semiconductor substrate, the plurality of metallization layers including at least a first metallization layer and a second metallization layer, wherein the second metallization layer is spaced apart from the semiconductor substrate with the first metallization layer therebetween, the second metallization layer being in electrical contact with the first metallization layer by a first via in a dielectric layer vertically spaced apart the first metallization layer and the second metallization layer;
   forming an interconnect aperture at least partially in the semiconductor substrate;
   forming an aperture insulator portion on a top surface of the second metallization layer, the aperture insulator portion being laterally smaller than the second metallization layer, the aperture insulator portion being formed at a location that laterally divides the second metallization layer into a contact portion and a non-contact portion, the contact portion being substantively smaller than the non-contact portion, the contact portion and the non-contact portion being defined by a side of the aperture insulator portion;
   forming a conductive interconnect extending at least partially through the semiconductor substrate, wherein the conductive interconnect includes a vertical section in the interconnect aperture and a horizontal section external to the interconnect aperture, and wherein the horizontal section includes a substantially-planar bottom surface, and wherein the horizontal section extends laterally toward the second metallization layer such that at least a portion of the substantially-planar bottom surface of the horizontal section is in physical contact with the top surface of the contact portion of the second metallization layer at a first horizontal location, and wherein the non-contact portion is electrically coupled to the first metallization layer at a second horizontal location different from the first horizontal location, and wherein the side of the aperture insulator portion faces the vertical section of the conductive interconnect, and wherein the conductive interconnect is in electrical contact with the second metallization layer, and wherein the first via is vertically aligned with the non-contact portion, and wherein the contact portion of the second metallization layer extends vertically from an upper surface of the dielectric layer to a lower surface of the horizontal section of the conductive interconnect.

4. The method of claim 3 wherein forming an interconnect aperture includes forming the interconnect aperture at least partially in the semiconductor substrate after the first metallization layer is formed.

5. The method of claim 3 wherein:
forming an interconnect aperture includes forming the interconnect aperture at least partially in the semiconductor substrate after the second metallization layer is formed;
the method further includes exposing at least a portion of the second metallization layer; and
the conductive interconnect is formed by filling the interconnect aperture with a conductive material;
filling the interconnect aperture includes introducing the interconnect material into the interconnect aperture and onto the exposed portion of the second metallization layer.

6. The method of claim 1 wherein:
the conductive material in the interconnect aperture includes a first end and a second end opposite the first end;
the second metallization layer includes a first portion generally corresponding to the conductive material in the interconnect aperture and a second portion extending laterally from the first portion; and
the first end of the conductive material in the interconnect aperture is electrically coupled to the first portion of the second metallization layer.

7. The method of claim 3 wherein:
the conductive material in the interconnect aperture includes a first end and a second end opposite the first end;
the second metallization layer includes a first portion generally corresponding to the conductive material in the interconnect aperture and a second portion extending laterally from the first portion; and
the first end of the conductive material in the interconnect aperture is electrically coupled to the first portion of the second metallization layer.

8. The method of claim 1, further comprising:
forming an insulation between the semiconductor substrate and the first metallization layer;
positioning an integrated circuit on or in the semiconductor substrate;
forming a conductive link at least partially in the insulation, the conductive link being between the integrated circuit and the first metallization layer; and
forming a dielectric between the first and second metallization layers, wherein the dielectric includes a conductive via directly between the first metallization layer and the second metallization layer.

9. The method of claim 1, further comprising:
forming a third metallization layer spaced apart from the semiconductor substrate by the first and second metallization layers.

10. The method of claim 1, wherein the vertical section and the horizontal section are made of a common material.

11. The method of claim 3, further comprising:
   forming an insulation between the semiconductor substrate and the first metallization layer;
   positioning an integrated circuit on or in the semiconductor substrate;
   forming a conductive link at least partially in the insulation, the conductive link being between the integrated circuit and the first metallization layer; and
   forming a dielectric between the first and second metallization layers, wherein the dielectric includes a conductive via directly between the first metallization layer and the second metallization layer.

12. The method of claim 3, further comprising:
   forming a third metallization layer spaced apart from the semiconductor substrate by the first and second metallization layers.

13. The method of claim 3, wherein the vertical section and the horizontal section are made of a common material.

14. The method of claim 1, further comprising:
   forming a dielectric layer on the top surface of the second metallization layer.

15. The method of claim 14, wherein the dielectric layer is made of a first material, and wherein the aperture insulator portion is made of a second material different than the first material.

16. The method of claim 3, further comprising:
   forming a dielectric layer on the top surface of the second metallization layer.

17. The method of claim 16, wherein the dielectric layer is made of a first material, and wherein the aperture insulator portion is made of a second material different than the first material.

* * * * *